(12) United States Patent
Lee et al.

(10) Patent No.: US 9,941,443 B2
(45) Date of Patent: Apr. 10, 2018

(54) SEMICONDUCTOR LIGHT EMITTING DEVICE

(71) Applicant: Samsung Electronics Co., Ltd., Suwon-si, Gyeonggi-do (KR)

(72) Inventors: Jin Sub Lee, Suwon-si (KR); Jung Sub Kim, Hwaseong-si (KR); Sam Mook Kang, Osan-si (KR); Yeon Woo Seo, Hwaseong-si (KR); Han Kyu Seong, Seoul (KR); Dae Myung Chun, Hwaseong-si (KR); Young Jin Choi, Seoul (KR); Jae Hyeok Heo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/063,150

(22) Filed: Mar. 7, 2016

(65) Prior Publication Data

US 2016/0190388 A1 Jun. 30, 2016

Related U.S. Application Data

(63) Continuation of application No. 14/454,536, filed on Aug. 7, 2014, now Pat. No. 9,312,439.

(30) Foreign Application Priority Data

Jan. 9, 2014 (KR) ........................ 10-2014-0002948

(51) Int. Cl.
*H01L 33/24* (2010.01)
*H01L 33/08* (2010.01)
(Continued)

(52) U.S. Cl.
CPC .......... *H01L 33/145* (2013.01); *H01L 33/002* (2013.01); *H01L 33/025* (2013.01);
(Continued)

(58) Field of Classification Search
None
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP 2012209488 A 10/2012
KR 20120055391 A 5/2012
(Continued)

*Primary Examiner* — Duy T Nguyen
*Assistant Examiner* — Bo Bin Jang
(74) *Attorney, Agent, or Firm* — Harness, Dickey & Pierce, P.L.C.

(57) ABSTRACT

There is provided a semiconductor light emitting device including a first conductivity-type semiconductor base layer and a plurality of light emitting nanostructures disposed to be spaced apart from one another on the first conductivity-type semiconductor base layer, each light emitting nanostructure including a first conductivity-type semiconductor core, an active layer, an electric charge blocking layer, and a second conductivity-type semiconductor layer, respectively, wherein the first conductivity-type semiconductor core has different first and second crystal planes in crystallographic directions.

20 Claims, 14 Drawing Sheets

(51) Int. Cl.
  *H01L 33/14* (2010.01)
  *H01L 33/18* (2010.01)
  *H01L 33/00* (2010.01)
  *H01L 33/02* (2010.01)
  *H01L 33/42* (2010.01)
  *H01L 33/48* (2010.01)
  *H01L 33/52* (2010.01)

(52) U.S. Cl.
  CPC .............. *H01L 33/08* (2013.01); *H01L 33/18* (2013.01); *H01L 33/24* (2013.01); *H01L 33/42* (2013.01); *H01L 33/486* (2013.01); *H01L 33/52* (2013.01); *H01L 2224/32225* (2013.01); *H01L 2224/48091* (2013.01); *H01L 2224/48227* (2013.01); *H01L 2224/48247* (2013.01); *H01L 2224/48257* (2013.01); *H01L 2224/73265* (2013.01); *H01L 2924/181* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,848 B2 | 5/2010 | Sugiura | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,353 B2 | 9/2011 | Park | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,227,819 B2 | 7/2012 | Zhong et al. | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 2007/0126009 A1 | 6/2007 | Sakai et al. | |
| 2009/0169828 A1 | 7/2009 | Hersee et al. | |
| 2010/0061078 A1 | 3/2010 | Kim | |
| 2010/0065881 A1* | 3/2010 | Kim | H01L 33/24 257/99 |
| 2012/0021549 A1 | 1/2012 | Fujikane et al. | |
| 2012/0068153 A1 | 3/2012 | Seong et al. | |
| 2012/0187365 A1 | 7/2012 | Jeong et al. | |

FOREIGN PATENT DOCUMENTS

| | | |
|---|---|---|
| KR | 20130015112 A | 2/2013 |
| KR | 20130067821 A | 6/2013 |
| KR | 20130080300 A | 7/2013 |

\* cited by examiner

SEMICONDUCTOR LIGHT EMITTING DEVICE

CROSS-REFERENCE TO RELATED APPLICATION

This application is a continuation application of U.S. application Ser. No. 14/454,536, filed on Aug. 7, 2014 which claims the benefit of priority to Korean Patent Application No. 10-2014-0002948 filed on Jan. 9, 2014, with the Korean Intellectual Property Office, the entire contents of each of which are hereby incorporated by reference.

TECHNICAL FIELD

The present disclosure relates to nano-structured light-emitting devices and methods for manufacturing the same.

BACKGROUND

Light emitting diodes (LEDs) having many advantages such as a long lifespan, low power consumption, a fast response speed, environmental friendliness, and the like, compared to related art light sources, have been widely seen as next generation lighting sources, and have come to prominence as an important light sources in various products such as general lighting devices and in the backlights of display devices. In particular, LEDs based on Group III nitrides, such as GaN, AlGaN, InGaN, InAlGaN, and the like, commonly serve as semiconductor light emitting devices outputting blue or ultraviolet light.

Recently, as LEDs have come into widespread use, utilization thereof has extended to light sources in high current and high output fields. Demand for LEDs in high current and high output fields has spurred ongoing research into improvements in light emitting characteristics in the art. In particular, in order to increase luminous efficiency through enhancements in crystallinity and increases in light emitting areas, semiconductor light emitting devices having light emitting nanostructures and a manufacturing technique therefor have been proposed.

In general, when an AlGaN electric charge blocking layer is used in nano-LEDs including light emitting nanostructures, the electrical charge blocking layer has a doping concentration similar to that of a p-GaN layer and has a thickness of approximately 10 nm. However, the light emitting nanostructures have different crystal planes, causing a difference in growth rates and impurity incorporation efficiency, and as a result, the use of the electric charge blocking layer increases a leakage current.

Accordingly, a need exists for an LED having characteristics of a diode operating within an intended operating voltage while having a reduced leakage current.

SUMMARY

An aspect of the present disclosure may provide a semiconductor light emitting device having a reduced degree of leakage current and enhanced light extraction efficiency.

An aspect of the present disclosure relates to a semiconductor light emitting device including a first conductivity-type semiconductor base layer; and a plurality of light emitting nanostructures disposed spaced apart from one another on the first conductivity-type semiconductor base layer and including a first conductivity-type semiconductor core, an active layer, an electric charge blocking layer, and a second conductivity-type semiconductor layer, respectively, wherein the first conductivity-type semiconductor core has different first and second crystal planes in crystallographic directions, and wherein the electric charge blocking layer includes an impurity having a first concentration, the second conductivity-type semiconductor layer includes the impurity having a second concentration, and the first concentration is half or less of the second concentration.

A thickness of the electric charge blocking layer may be less than that of the second conductivity-type semiconductor layer.

The first concentration may be an impurity concentration in a region of at least one of the first and second crystal planes of the electric charge blocking layer.

The electric charge blocking layer may have an impurity concentration greater in a region on the first crystal planes than in a region on the second crystal planes The electric charge blocking layer may have a thickness ranging from approximately 20 nm to 50 nm on the first crystal planes.

The electric charge blocking layer may have a thickness greater on the first crystal planes than on the second crystal planes.

The impurity may be a p-type impurity.

The impurity may be magnesium (Mg).

The electric charge blocking layer may include AlGaN or AlInGaN.

The first crystal planes may be non-polar planes, and the second crystal planes may be polar planes or semi-polar planes.

The first crystal planes may be m faces and the second crystal planes may be r faces.

The plurality of light emitting nanostructures may further include a transparent electrode layer positioned on the second conductivity-type semiconductor layer.

Another aspect of the present disclosure relates to a semiconductor light emitting device including a first conductivity-type semiconductor base layer; and a plurality of light emitting nanostructures disposed spaced apart from one another on the first conductivity-type semiconductor base layer and including a first conductivity-type semiconductor core, an active layer, an electric charge blocking layer, and a second conductivity-type semiconductor layer, respectively, wherein the first conductivity-type semiconductor core has different first and second crystal planes in crystallographic directions, and wherein the electric charge blocking layer has different thicknesses and impurity concentrations on the first and second crystal planes.

The electric charge blocking layer may include an impurity having a first concentration, the second conductivity-type semiconductor layer has the impurity having a second concentration, and the first concentration may be half or less of the second concentration.

The impurity may be magnesium (Mg).

Another aspect of the present disclosure relates to a lighting device having a light-emitting device package including a package body, an encapsulant and a light-emitting device, the light-emitting device including a first conductivity-type semiconductor base layer, and a plurality of light emitting nanostructures disposed spaced apart from one another on the first conductivity-type semiconductor base layer and including a first conductivity-type semiconductor core, an active layer, an electric charge blocking layer, and a second conductivity-type semiconductor layer, respectively, wherein the first conductivity-type semiconductor core has different first and second crystal planes in crystallographic directions, and wherein the light-emitting device has first and second impurity concentrations.

The electric charge blocking layer may include the first impurity concentration, the second conductivity-type semiconductor layer may include the second impurity concentration, and the first impurity concentration may be half or less of the second impurity concentration.

The electric charge blocking layer may have different thicknesses and the first and second impurity concentrations on the first and second crystal planes, respectively.

The impurity may be magnesium (Mg).

The lighting device may be a bulb-type lamp.

BRIEF DESCRIPTION OF DRAWINGS

The foregoing and other features of the present disclosure will be apparent from more particular description of embodiments of the inventive concept, as illustrated in the accompanying drawings in which like reference characters may refer to the same or similar elements throughout the different views. The drawings are not necessarily to scale, emphasis instead being placed upon illustrating the principles of the embodiments of the inventive concept. In the drawings, the thickness of layers and regions may be exaggerated for clarity.

The above and other aspects, features and other advantages of the present disclosure will be more clearly understood from the following detailed description taken in conjunction with the accompanying drawings, in which.

DETAILED DESCRIPTION

Figure 1:
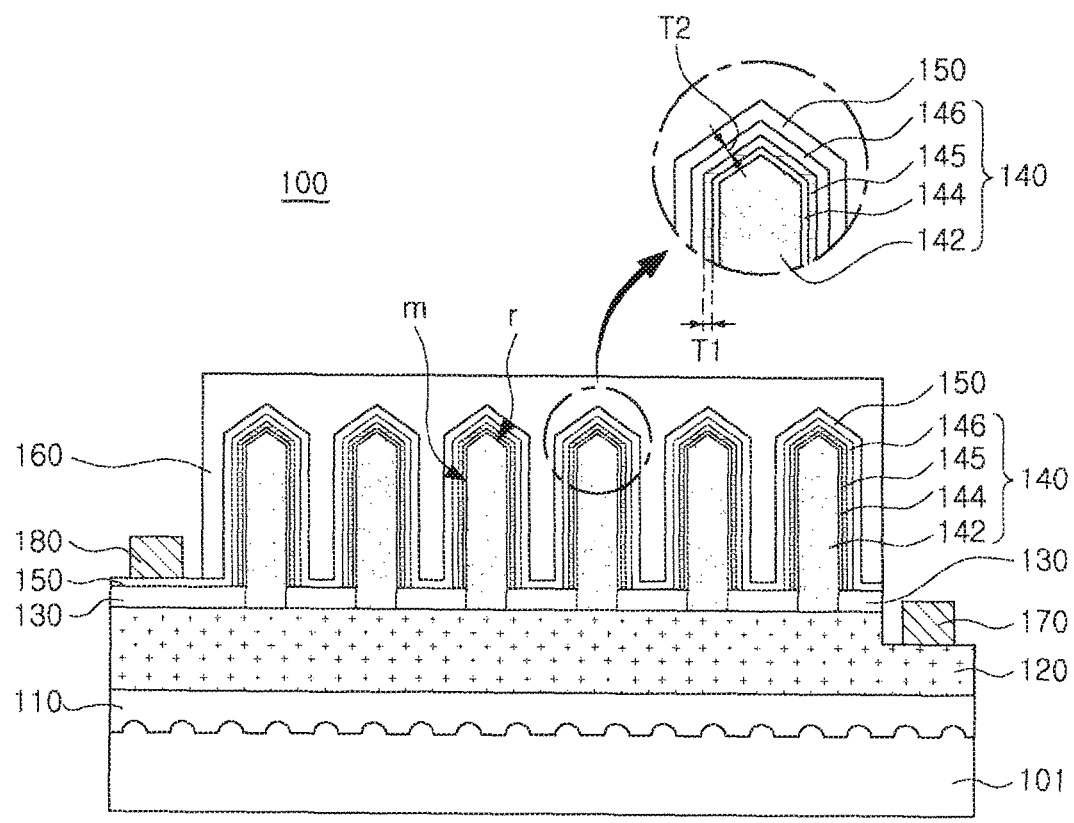
FIG. 1 is a cross-sectional front elevation view of a semiconductor light emitting device according to an example embodiment of the present disclosure.

Hereinafter, example embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Referring to FIG. 1, a semiconductor light emitting device includes a substrate 101, and a first conductivity-type semiconductor base layer 120, an insulating layer 130 a light emitting nanostructure 140, a transparent electrode layer 150, and a filler layer 160 formed on the substrate 101. The light emitting nanostructure 140 includes a first conductivity-type semiconductor core 142, an active layer 144, an electric charge blocking layer 145, and a second conductivity-type semiconductor layer 146 grown from the first conductivity-type semiconductor base layer 120. The semiconductor light emitting device 100 may further include first and second electrodes 170 and 180 electrically connected to the first conductivity-type semiconductor base layer 120 and the second conductivity-type semiconductor layer 146, respectively.

In the present disclosure, unless otherwise mentioned, terms such as 'upper portion', 'upper surface', 'lower portion', 'lower surface', 'lateral surface', and the like, are determined based on the drawings, and in actuality, the terms may be changed according to a direction in which a device is disposed.

The substrate 101 may be provided as a semiconductor growth substrate and may be formed of an insulating, a conductive, or a semiconductive material such as sapphire, SiC, $MgAl_2O_4$, MgO, $LiAlO_2$, $LiGaO_2$, GaN, or the like. A sapphire substrate is a crystal having Hexa-Rhombo R3c symmetry, of which lattice constants in c-axial and a-axial directions are approximately 13.001 Å and 4.758 Å, respectively, and has a C-plane (0001), an A-plane (11-20), an R-plane (1-102), and the like. In this case, the C-plane of sapphire crystal allows a nitride thin film to be relatively easily grown thereon and is stable at high temperatures, so the sapphire substrate is commonly used as a nitride growth substrate. Meanwhile, in a case in which the substrate 101 is formed of silicon (Si), it may be more appropriate for increasing a diameter and is relatively low in price, facilitating mass-production.

A depression and protrusion pattern may be formed on a surface of the substrate 101 to enhance light extraction efficiency. However, a shape of the depression and protrusion pattern is not limited to that illustrated in the drawings. According to an example embodiment, a buffer layer 110 may be further disposed on the substrate 101 in order to enhance crystallinity of the first conductivity-type semiconductor base layer 120. The buffer layer 110 may be formed of, for example, $Al_xGa_{1-x}N$ grown at a low temperature without being doped.

The first conductivity-type semiconductor base layer 120 may be disposed on the substrate 101. The first conductivity-type semiconductor base layer 120 may be formed of a Group III-V compound, for example, GaN. The first conductivity-type semiconductor base layer 120 may be, for example, n-GaN doped with an n-type impurity.

In the present example embodiment, the first conductivity-type semiconductor base layer 120 may be commonly connected to one side of the respective light emitting nanostructures 140 to serve as a contact electrode, as well as providing crystal planes for growing the first conductivity-type semiconductor core 142.

The insulating layer 130 is disposed on the first conductivity-type semiconductor base layer 120. The insulating layer 130 may be formed of a silicon oxide or a silicon nitride, and may be formed of at least one of $SiO_x$, $SiO_xN_y$, $Si_xN_y$, $Al_2O_3$, TiN, AlN, ZrO, TiAlN, and TiSiN, for example. The insulating layer 130 includes a plurality of openings (refer to FIG. 6B) exposing portions of the first conductivity-type semiconductor base layer 120. A diameter, a length, a position, and growth conditions of the light emitting nanostructures 140 may be determined according to a size of the plurality of openings. The plurality of openings may have various shapes such as a circular shape, a quadrangular shape, a hexagonal shape, and the like.

The plurality of light emitting nanostructures 140 may be disposed at positions corresponding to the plurality of openings. The light emitting nanostructures 140 may have a core-shell structure, including the first conductivity-type semiconductor core 142 grown from regions of the first conductivity-type semiconductor base layer 120 exposed by the plurality of openings, the active layer 144 sequentially formed on a surface of the first conductivity-type semiconductor core 142, the electric charge blocking layer 145, and the second conductivity-type semiconductor layer 146.

The first conductivity-type semiconductor core 142 and the second conductivity-type semiconductor layer 146 may respectively be formed of a semiconductor doped with an n-type impurity and a p-type impurity, but the present disclosure is not limited thereto. Conversely, the first conductivity-type semiconductor core 142 and the second conductivity-type semiconductor layer 146 may respectively be formed of p-type and n-type semiconductors. The first conductivity-type semiconductor core 142 and the second conductivity-type semiconductor layer 146 may be formed of a nitride semiconductor, e.g., a material having a composition of $Al_xIn_yGa_{1-x-y}N$ ($0 \leq x \leq 1$, $0 \leq y \leq 1$, $0 \leq x+y \leq 1$). Each of the semiconductor layers 142 and 146 may be configured as a single layer, or may include a plurality of layers having different characteristics such as different doping concentrations, compositions, and the like. Here, the first conductivity-type semiconductor core 142 and the second conductivity-type semiconductor layer 146 may be formed of an AlInGaP or AlInGaAs semiconductor, besides a nitride semiconductor. In the present example embodiment, the first conductivity-type semiconductor core 142 may be formed of n-GaN doped with silicon (Si) or carbon (C), and the second conductivity-type semiconductor layer 146 may be formed of p-GaN doped with magnesium (Mg) or zinc (Zn).

Also, in FIG. 1, it is illustrated that the first conductivity-type semiconductor core 142 has a width equal to that of the openings of the insulating layer 130, but this is merely illustrative and the first conductivity-type semiconductor core 142 may have a width greater than that of the openings.

The active layer 144 may be disposed on a surface of the first conductivity-type semiconductor core 142. The active layer 144 may be a layer emitting light having a predetermined level of energy according to electron-hole recombination and formed of a single material such as InGaN, or the like, or may have a multi-quantum well (MQW) structure in which quantum barrier layers and quantum well layers are alternately disposed, and, for example, in case of a nitride semiconductor, an GaN/InGaN structure may be used. In the case in which the active layer 144 includes InGaN, since the content of indium (In) is increased, crystal defects due to lattice mismatches may be reduced and internal quantum efficiency of the semiconductor light emitting device 100 may be increased. Also, an emission wavelength may be adjusted according to the content of indium (In).

The electric charge blocking layer 145 may be disposed between the active layer 144 and the second conductivity-type semiconductor layer 146. The electric charge blocking layer 145 may prevent electric charges injected from the first conductivity-type semiconductor core 142 from being moved to the second conductivity-type semiconductor layer 146, rather than being used for electron-hole recombination in the active layer 144, thus preventing a degradation of luminous efficiency. For example, in a case that the first conductivity-type semiconductor core 142 is an n-type semiconductor, the electric charge blocking layer 145 may be an electron blocking layer serving to block electrons. Thus, the electric charge blocking layer 145 may include a material having bandgap energy greater than that of the active layer 144, for example, AlGaN or AlInGaN. As the content of aluminum (Al) is increased, bandgap energy may be increased, and the addition of indium (In) may enhance crystallinity.

The electric charge blocking layer 145 may include an impurity having a first concentration. The impurity may be a p-type impurity such as magnesium (Mg) or zinc (Zn). Also, the impurity may be identical to that included in the second conductivity-type semiconductor layer 146 or may be a material having a conductivity type identical to that included in the second conductivity-type semiconductor layer 146. For example, both the electric charge blocking layer 145 and the second conductivity-type semiconductor layer 146 may include magnesium (Mg). When a concentration of the impurity of the second conductivity-type semiconductor layer 146 is a second concentration, the first concentration may be half or less of the second concentration. For example, a ratio of the first concentration and the second concentration may be 0.5 or less, or may be 0.25 or less according to an example embodiment.

A thickness T1 of the electric charge blocking layer 145 may be less than a thickness T2 of the second conductivity-type semiconductor layer 146. An average value of the thickness T1 of the electric charge blocking layer 145 may range from approximately 10 nm to 50 nm.

An impurity concentration and thickness of the electric charge blocking layer 145 will be described in more detail with reference to FIGS. 4 through 5B.

The number of light emitting nanostructures 140 included in the semiconductor light emitting device 100 is not limited to that illustrated in the drawings and the semiconductor light emitting device 100 may include, for example, tens to millions of light emitting nanostructures 140. The light emitting nanostructures 140 according to the present disclosure may include a lower hexagonal prism region and an upper hexagonal pyramid region. According to an example embodiment, the light emitting nanostructures may have a pyramid shape or a pillar shape. Since the light emitting nanostructures 140 have a three-dimensional shape, a light emitting surface area is relatively large, increasing luminous efficiency. Also, the light emitting nanostructure 140 may have first and second crystal planes m and r being different crystallographically. This will be described in detail with reference to FIG. 2 below.

The transparent electrode layer 150 is electrically connected to the second conductivity-type semiconductor layer 146. The transparent electrode layer 150 may cover upper surfaces and lateral surfaces of the light emitting nanostructure 140 and may be connected between adjacent light emitting nanostructures 140. The transparent electrode layer 150 may be formed of, for example, indium tin oxide (ITO), aluminum zinc oxide (AZO), indium zinc oxide (IZO), ZnO, GZO (ZnO:Ga), $In_2O_3$, $SnO_2$, CdO, $CdSnO_4$, or $Ga_2O_3$.

The filler layer 160 may be disposed on the light emitting nanostructures 140 and the transparent electrode layer 150. The filler layer 160 may fill spaces between adjacent light emitting nanostructures 140 and may be disposed to cover the light emitting nanostructures 140 and the transparent electrode layer 150 on the light emitting nanostructures 140. According to an example embodiment, an upper surface of the filler layer 160 may be formed to be uneven along the light emitting nanostructures 140.

The filler layer 160 may be formed of a light-transmissive insulating material and include, for example, $SiO_2$, $SiN_x$, $Al_2O_3$, HfO, $TiO_2$, or ZrO. However, according to an example embodiment, the filler layer 160 may include a conductive material. In this case, the filler layer 160 may be formed to be electrically connected to the second electrode 180 or may be integrally formed with the second electrode 180, and the semiconductor light emitting device 100 may be mounted in a flipchip structure such that the first and second electrodes 170 and 180 face an external board such as a package board. According to an example embodiment, a passivation layer may be disposed on the filler layer 160. The passivation layer may be disposed to expose only upper surfaces of the first and second electrodes 170 and 180.

The first and second electrodes 170 and 180 may be disposed on the first conductivity-type semiconductor base layer 120 and the transparent electrode layer 150, respectively, on one side of the semiconductor light emitting device 100 such that the first and second electrodes 170 and 180 are electrically connected to the first conductivity-type semiconductor base layer 120 and the second conductivity-type semiconductor 146, respectively.

The first and second electrodes 170 and 180 may be formed as a single layer or may have a multilayer structure of a conductive material. For example, the first and second electrodes 170 and 180 may include one or more of Au, Ag, Cu, Zn, Al, In, Ti, Si, Ge, Sn, Mg, Ta, Cr, W, Ru, Rh, Ir, Ni, Pd, Pt, and an alloy thereof.

According to an example embodiment of the present disclosure, in a case that the substrate 101 is formed of a conductive material, the first electrode 170 may be disposed below the substrate 101 or may be omitted. However, dispositions and shapes of the first and second electrodes 170 and 180 are merely illustrative and may be variously modified.

Figure 2:
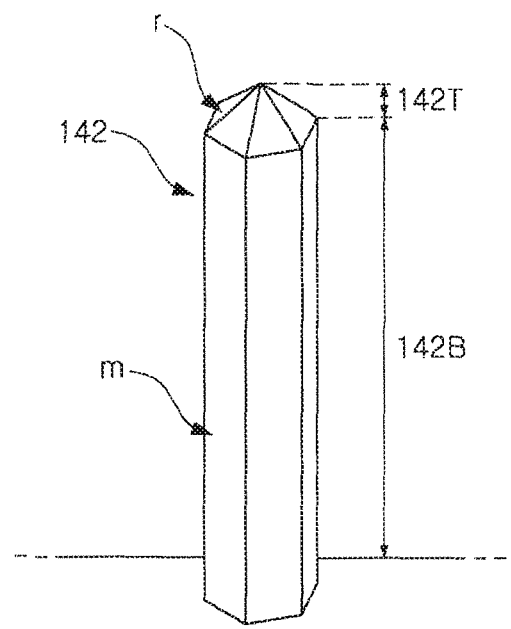
FIG. 2 is a perspective view of a first conductivity-type semiconductor core employable in a semiconductor light emitting device according to an example embodiment of the present disclosure.

Referring to FIG. 2, the first conductivity-type semiconductor core 142 may include a body portion 142B providing lateral surfaces having first crystal planes and a tip portion 142T providing surfaces having second crystal planes different from the first crystal planes. In a case in which the first conductivity-type semiconductor core 142 has a crystal structure having a hexagonal system such as a gallium nitride single crystal, the first crystal planes may be non-polar planes, for example m planes, and the second crystal planes may be semi-polar planes, for example r planes.

Referring to FIG. 2 together with FIG. 1, although the active layer 144 is grown on the surface of the first conductivity-type semiconductor core 142, thicknesses and compositions of the active layer 144, the electric charge blocking layer 145, and the second conductivity-type semiconductor layer 146 grown on the first and second crystal planes may be different due to differences in the characteristics of respective crystal planes.

Figure 3:
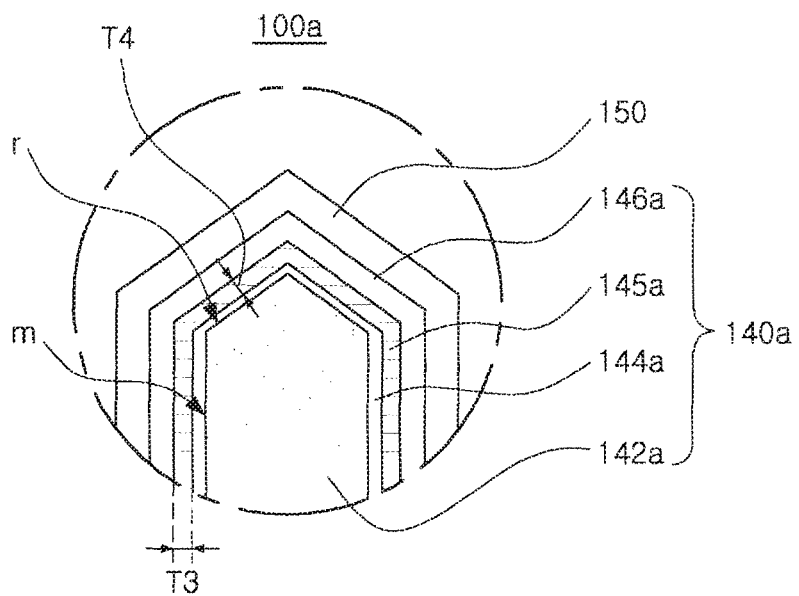
FIG. 3 is a cross-sectional partial view of a light emitting nanostructure employable in a semiconductor light emitting device according to an example embodiment of the present disclosure.

Referring to FIG. 3, a light emitting nanostructure 140a of a semiconductor light emitting device 100a may include a first conductivity-type semiconductor core 142a, an active layer 144a, an electric charge blocking layer 145a, and a second conductivity-type semiconductor layer 146a. The light emitting nanostructure 140a is illustrated as a region corresponding to the region of the light emitting nanostructure 140 enlarged in FIG. 1. Components other than the light emitting nanostructure 140a may be identical to those of the semiconductor light emitting device 100 of FIG. 1.

In the present example embodiment, the active layer 144a, the electric charge blocking layer 145a, and the second conductivity-type semiconductor layer 146a grown on the first conductivity-type semiconductor core 142a may have a relatively high impurity concentration and a relatively high thickness on the m planes, relative to the r planes.

In detail, regions on the m planes of the electric charge blocking layer 145a may have an impurity concentration slightly higher than that of regions on the r planes. This may result from a difference in impurity incorporation efficiency according to crystal directions. Also, the ratio of the impurity concentrations in the region on the m planes and the region on the r planes may vary depending on manufacturing process and process conditions and may range from 1:1 to 1:0.7, for example.

When the electric charge blocking layer 145a has an impurity having a first concentration and the second conductivity-type semiconductor layer 146a has an impurity having a second concentration in the region on the m planes and the region on the r planes on average, the first concentration may be half or less of the second concentration. For example, the ratio of the first concentration and the second concentration may be 0.5 or less, and according to an example embodiment, it may be 0.25 or less. According to an example embodiment, an impurity concentration of at least one of the region on the m planes and the region on the r planes in the electric charge blocking layer 145a may be half or less of the second concentration.

Also, in the electric charge blocking layer 145a, a region thereof on the m planes has a third thickness T3, and a region thereof on the r planes may have a fourth thickness T4 less than the third thickness T3. A ratio of the third thickness T3 and the fourth thickness T4 may range from 1:1 to 5:1, and it may vary depending on a manufacturing process and process conditions. The third thickness T3 may range from approximately 20 nm to 50 nm.

Figure 4:
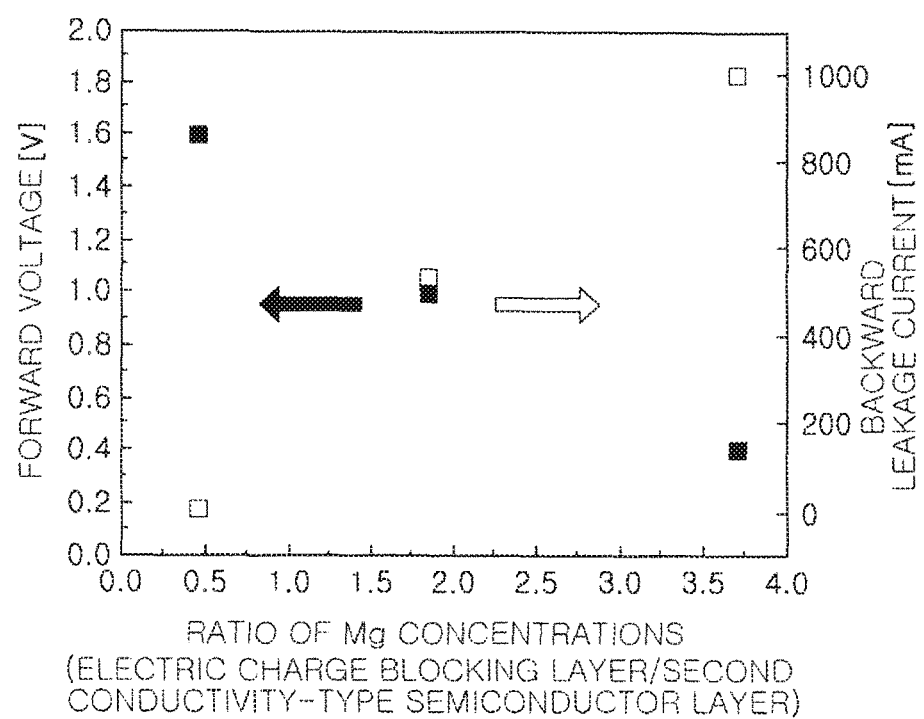
FIG. 4 is a graph illustrating electrical properties of a semiconductor light emitting device according to an example embodiment of the present disclosure.

Referring to FIG. 4 together with FIG. 1, in the semiconductor light emitting device including the active layer 144 formed of QW of InGaN/GaN and the electric charge blocking layer 145 formed of AlGaN, forward voltage (indicated by "■") and backward leakage current (indicated by "□") characteristics appear according to a ratio between an Mg concentration of the electric charge blocking layer 145 and that of the second conductivity-type semiconductor layer 146 (hereinafter, referred to as the 'ratio of Mg concentrations'). In detail, the ratio of the Mg concentrations is a value obtained by dividing a ratio of an Mg element to a Group-III element in the electric charge blocking layer 145 by a ratio of an Mg element to a Group-III element in the second conductivity-type semiconductor layer 146.

As the ratio of the Mg concentrations is increased, the backward leakage current of the semiconductor light emitting device is increased and the forward voltage is decreased. The increase in the backward leakage current degrades efficiency of the semiconductor light emitting device, so the backward leakage current is required not to be increased to above a predetermined value. In the present disclosure, a 'forward voltage' refers to a voltage at which a predetermined forward current flows below an operating voltage of the semiconductor light emitting device. Thus, as the forward voltage value has a great value close to the operating voltage, the semiconductor light emitting device has sharp diode characteristics.

In a case that the ratio of the Mg concentrations is less than 0.5, the backward leakage current is lowered to below a few mA, exhibiting a relatively high forward voltage. Thus, it can be seen that, in the semiconductor light emitting device, when the Mg concentration of the electric charge blocking layer 145 is half or less of the Mg concentration of the second conductivity-type semiconductor layer 146, the leakage current is reduced and diode characteristics are secured.

Figure 5A:
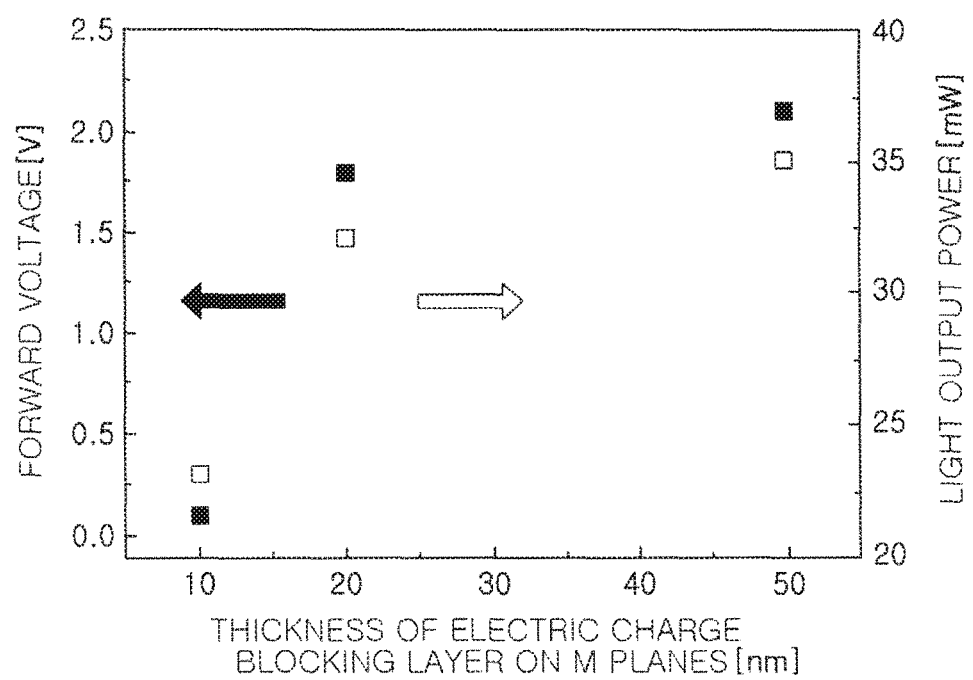
FIGS. 5A and 5B are graphs illustrating electrical properties of a semiconductor light emitting device according to an example embodiment of the present disclosure.

Referring to FIG. 5A together with FIG. 3, in the semiconductor light emitting device including the active layer 144a formed of QW of InGaN/GaN and the electric charge blocking layer 145a formed of AlGaN, forward voltage (indicated by "■") and light output power (indicated by "□") characteristics appear according to a thickness of the electric charge blocking layer 145a on the m planes. As the thickness of the electric charge blocking layer 145a on the m planes is increased, both the forward voltage and light output power of the semiconductor light emitting device are increased.

Figure 5B:
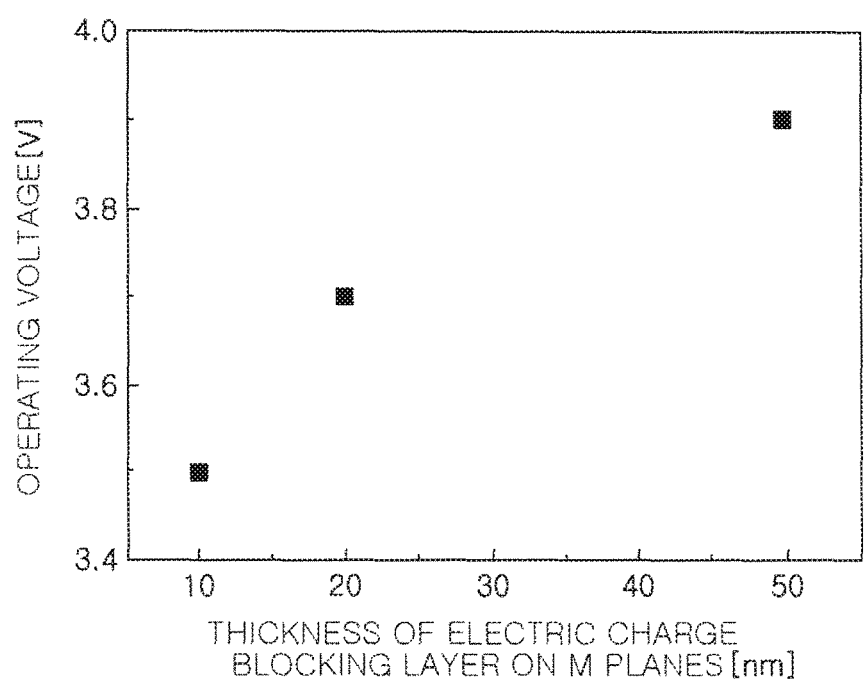

Referring to FIG. 5B, an operating voltage is changed according to a thickness of the electric charge blocking layer 145a on the m planes. As the thickness of the electric charge blocking layer 145a on the m planes is increased, an operating voltage is increased.

Thus, in a case that a thickness of the electric charge blocking layer 145a on the m planes is equal to or greater than 20 nm, both the forward voltage and the light output power have values within an appropriate range. However, since the operating voltage is also increased, preferably the electric charge blocking layer 145a on the m planes is equal to or lower than 50 nm. Thus, the thickness of the electric charge blocking layer 145a may have a thickness ranging from 20 nm to 50 nm, and a thickness of the electric charge blocking layer 145a on the r planes may be equal to or lower than the range.

Figure 6A:
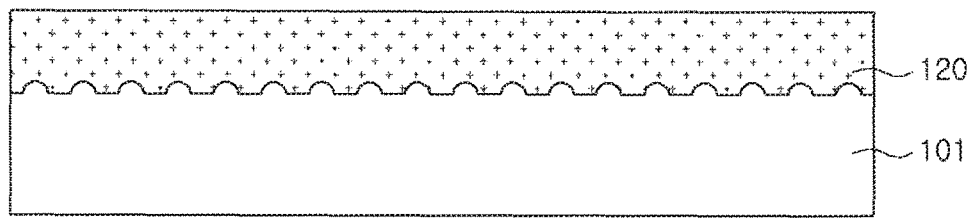
FIGS. 6A through 6E are cross-sectional front elevation views illustrating a method of manufacturing a semiconductor light emitting device according to an example embodiment of the present disclosure.

Referring to FIG. 6A, a depression and protrusion pattern may an upper surface of the substrate 101 and a first conductivity-type semiconductor may be grown on the substrate 101 to form a first conductivity-type semiconductor base layer 120.

The first conductivity-type semiconductor base layer 120 may provide a crystal growth surface allowing the light emitting nanostructures 140 (refer to FIG. 1) to grow thereon, and may be a structure electrically connecting one side of the light emitting nanostructures 140. Thus, the first conductivity-type semiconductor base layer 120 may be formed as a semiconductor single crystal having electrical conductivity, and in this case, the substrate 101 may be a substrate for crystal growth.

Figure 6B:
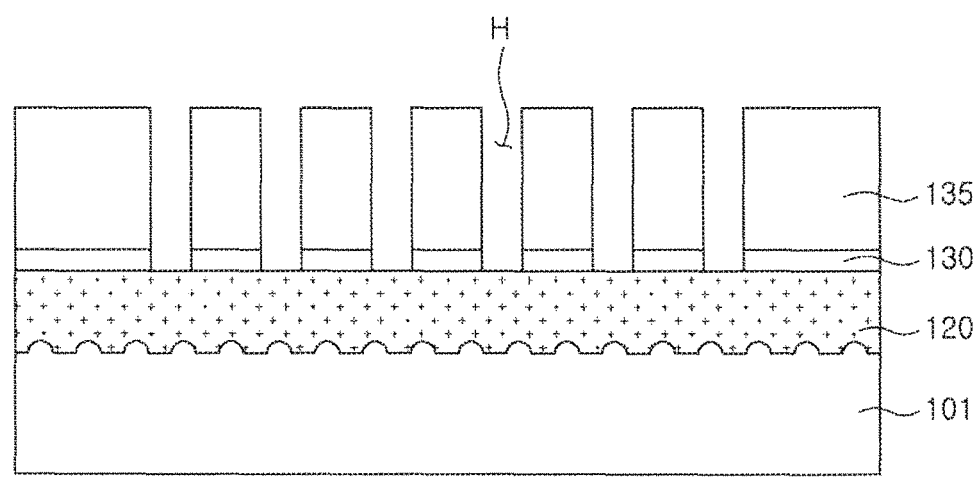

Referring to FIG. 6B, an insulating layer 130 and a mask layer 135 having a plurality of openings H exposing the first conductivity-type semiconductor base layer 120 may be formed on the first conductivity-type semiconductor base layer 120.

First, an insulating material for forming the insulating layer 130 and a material for forming the mask layer 135 may be sequentially deposited and patterned using a mask pattern (not shown) to form the insulating layer 130 and the mask layer 135. The insulating layer 130 and the mask layer 135 may be formed of materials having different etching rates under particular etching conditions, whereby an etching process may be controlled when the plurality of openings H are formed. For example, the insulating layer 130 is formed of SiN, and the mask layer 135 is formed of an insulating material including a silicon oxide or a silicon nitride, for example, $SiO_2$, SiN, $TiO_2$, $Si_3N_4$, $Al_2O_3$, TiN, AlN, $ZrO_2$, TiAlN, TiSiN, or the like.

The sum of thicknesses of the insulating layer 130 and the mask layer 135 may be designed in consideration of an intended height of the light emitting nanostructures 140 (refer to FIG. 1). Also, a size of the openings H may be designed in consideration of an intended size of the light emitting nanostructures 140.

Figure 6C:
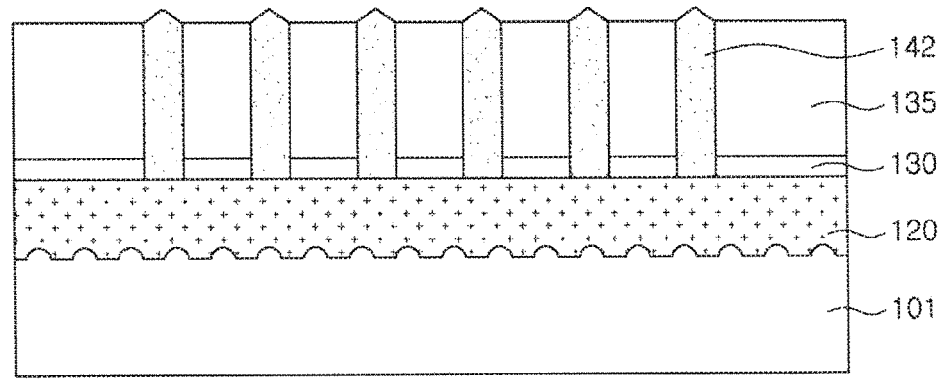

Referring to FIG. 6C, a first conductivity-type semiconductor is grown on the exposed regions of the first conductivity-type semiconductor base layer 120 such that the plurality of openings H are filled, thus forming a plurality of first conductivity-type semiconductor cores 142.

The first conductivity-type semiconductor cores 142 may be formed of, for example, an n-type nitride semiconductor, and may be formed of a material identical to that of the first conductivity-type semiconductor base layer 120. The first conductivity-type semiconductor core 142 may be formed using metal-organic chemical vapor deposition (MOCVD) or molecular beam epitaxy (MBE).

Figure 6D:
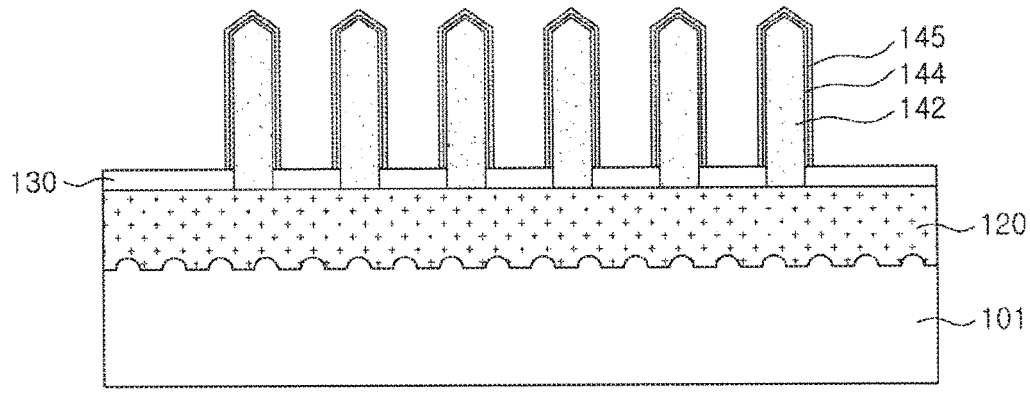

Referring to FIG. 6D, the mask layer 135 may be removed to expose the lateral surfaces of the plurality of first conductivity-type semiconductor cores 142, and an active layer 144 and an electric charge blocking layer 145 may be formed.

First, the mask layer 135 may be selectively removed with respect to the insulating layer 130 and the first conductivity-type semiconductor cores 142 to leave the insulating layer 130. The removing of the mask layer 135 may be performed by a wet etching process, for example. The insulating layer 130 may serve to prevent the active layer 144, the electric charge blocking layer 145, and the second conductivity-type semiconductor layer 146 from being connected to the first conductivity-type semiconductor base layer 120 in a follow-up process.

According to an example embodiment of the present disclosure, after the mask layer 135 is removed, a heat-treatment process may be performed to convert crystal planes of the first conductivity-type semiconductor core 142 into stable planes advantageous to crystal growth, such as semi-polar or non-polar crystal planes.

Thereafter, the active layer 144 and the electric charge blocking layer 145 may be sequentially grown on surfaces of the first conductivity-type semiconductor cores 142. Accordingly, light emitting nanostructures 140 having a core-shell structure may be formed. As described above, m planes and r planes of the first conductivity-type semiconductor cores 142 may have different thicknesses and impurity concentrations according to a deposition method.

Figure 6E:
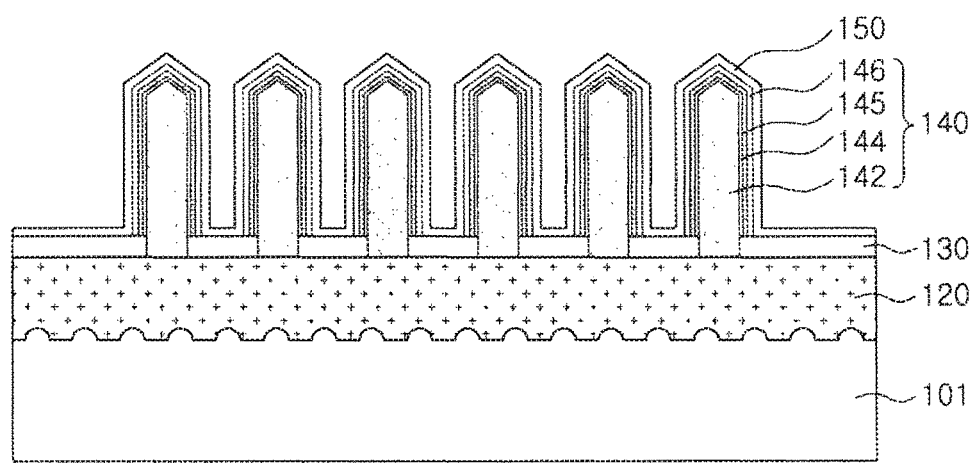

Referring to FIG. 6E, a second conductivity-type semiconductor layer 146 and a transparent electrode layer 150 may be formed on the electric charge blocking layer 145.

The transparent electrode layer 150 may extend to upper surfaces of the insulating layer 130 between adjacent light emitting nanostructures 140 and may be formed as a single layer on the plurality of light emitting nanostructures 140.

Thereafter, referring to FIG. 6E together with FIG. 1, the filler layer 160 may be formed on the transparent electrode layer 150. According to an example embodiment, the filler layer 160 may be formed as a plurality of layers, and in this case, the plurality of layers may be formed of different materials, respectively, or when the plurality of layers are formed of the same material, the layers may be formed through different deposition processes. Thereafter, a region of the first conductivity-type semiconductor base layer 120 is exposed to form a first electrode 170, and a second electrode 180 may be formed on the transparent electrode layer 150.

Figure 7:
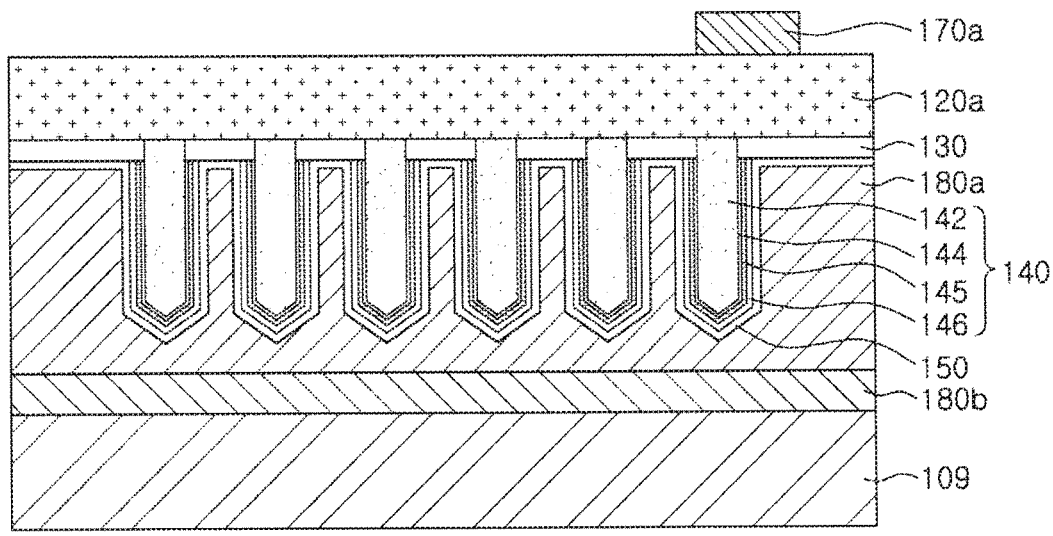
FIG. 7 is a cross-sectional front elevation view illustrating a semiconductor light emitting device according to an example embodiment of the present disclosure.

In FIG. 7, reference numerals identical to those of FIG. 1 denote the same components, so a redundant description will be omitted.

Referring to FIG. 7, a semiconductor light emitting device 100b includes a conductive substrate 109, a first conductivity-type semiconductor base layer 120a, an insulating layer 130, light emitting nanostructures 140, and a transparent electrode layer 150. However, in the present example embodiment, the transparent electrode layer 150 may be omitted. The light emitting nanostructure 140 includes a first conductivity-type semiconductor core 142 grown on the first conductivity-type semiconductor base layer 120a, an active layer 144, an electric charge blocking layer 145, and a second conductivity-type semiconductor layer 146. The semiconductor light emitting device 100b may further include a first electrode 170a and second electrodes 180a and 180b electrically connected to the first conductivity-type semiconductor 120a and the second conductivity-type semiconductor layer 146, respectively.

The substrate 109 may be a conductive substrate, for example, a silicon (Si) substrate or a Si—Al alloy substrate.

The second electrodes 180a and 180b may include a contact electrode layer 180a and a bonding electrode layer 180b. The substrate 109 may be bonded to contact electrode layer 180a by the medium of the bonding electrode layer 180b.

The contact electrode layer 180a may include a material appropriate for realizing ohmic-contact with the second conductivity-type semiconductor layer 146 of the light emitting nanostructures 140. The contact electrode layer 180a may be formed of, for example, GaN, InGaN, ZnO, or a graphene layer. Also, the contact electrode layer 180a may include a material such as Ag, Ni, Al, Rh, Pd, Ir, Ru, Mg, Zn, Pt, Au, or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like. In particular, the contact electrode layer 180a may be formed as a reflective metal layer in consideration of light extraction efficiency. In this case, the contact electrode layer 180a may upwardly reflect light emitted from the active layer 144 and traveling toward the substrate 109.

The bonding electrode layer 180b may be, for example, a eutectic metal layer such as Ni/Sn.

The semiconductor light emitting device 100b according to the present example embodiment may be manufactured by a process of forming the contact electrode layer 180a, instead of the filler layer 160, and forming the bonding electrode layer 180b on the contact electrode layer 180a during the process as described above with reference to FIG. 6E. Thereafter, the conductive substrate 109 is bonded to the contact electrode layer 180a, and the substrate 101 (refer to FIG. 1), a growth substrate of semiconductor layers, on the first conductivity-type semiconductor 120a, may be removed. The first conductivity-type semiconductor base layer 120a according to the present example embodiment may not have a depression and protrusion pattern such as that of the semiconductor light emitting device 100 of FIG. 1, but the present disclosure is not limited thereto.

Figure 8:
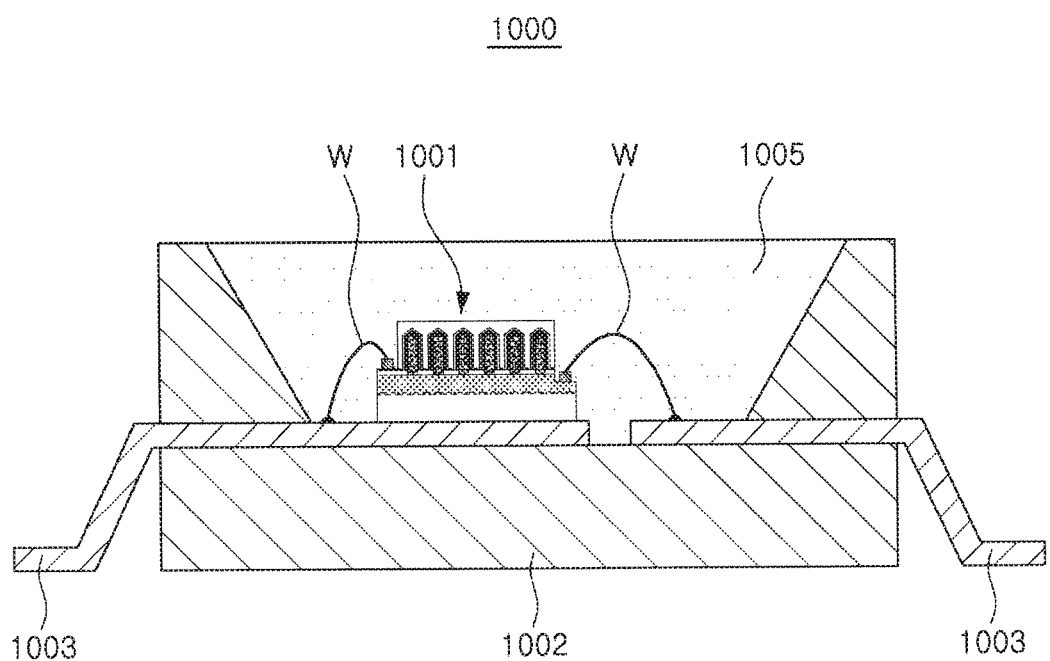
FIGS. 8 and 9 are cross-sectional front elevation views illustrating examples of packages employing a semiconductor light emitting device according to an example embodiment of the present disclosure.
Figure 9:
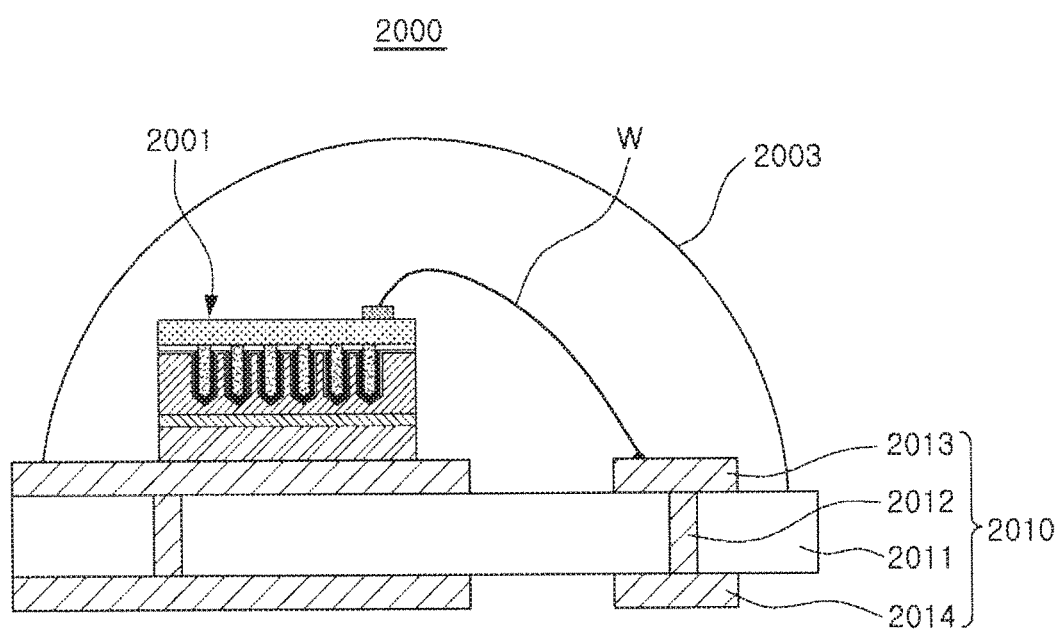

FIGS. 8 and 9 are views illustrating examples of packages employing a semiconductor light emitting device according to an example embodiment of the present disclosure.

Referring to FIG. 8, a semiconductor light emitting device package 1000 may include a semiconductor light emitting device 1001, a package body 1002, and a pair of lead frames 1003. The semiconductor light emitting device 1001 may be mounted on the lead frame 1003 and electrically connected to the lead frame 1003 through a wire W. According to an example embodiment, the semiconductor light emitting device 1001 may be mounted on a different region, for example, on the package body 1002, rather than on the lead frame 1003. The package body 1002 may have a cup shape to improve reflectivity efficiency of light. An encapsulant 1005 formed of a light-transmissive material may be formed in the reflective cup to encapsulate the semiconductor light emitting device 1001, the wire W, and the like.

In the present example embodiment, the semiconductor light emitting device package 1000 is illustrated as including the semiconductor light emitting device 1001 having a structure identical to that of the semiconductor light emitting device 100 illustrated in FIG. 1, but it may also include the semiconductor light emitting device 100b according to another example embodiment of the present disclosure as described above with reference to FIG. 7.

Referring to FIG. 9, a semiconductor light emitting device package 2000 may include a semiconductor light emitting device 2001, a mounting board 2010, and an encapsulant 2003. The semiconductor light emitting device 2001 may be mounted on the mounting board 2010 and be electrically connected to the mounting board 2010 through a wire W and the conductive substrate 109 (refer to FIG. 7).

The mounting board 2010 may include a board body 2011, an upper electrode 2013, and a lower electrode 2014. Also, the mounting board 2010 may include a through electrode 2012 connecting the upper electrode 2013 and the lower electrode 2014. The mounting board 2010 may be provided as a board such as PCB, MCPCB, MPCB, FPCB, or the like, and the structure of the mounting board 2010 may be applied to have various forms.

The encapsulant 2003 may be formed to have a lens structure with an upper surface having a convex dome shape. However, according to an example embodiment, the encapsulant 2003 may have a lens structure having a convex or concave surface to adjust a beam angle of light emitted through an upper surface of the encapsulant 2003.

In the present example embodiment, the semiconductor light emitting device package 2000 is illustrated as including the semiconductor light emitting device 2001 having a structure identical to that of the semiconductor light emitting device 100b illustrated in FIG. 7, but it may also include the semiconductor light emitting device 100 according to another example embodiment of the present disclosure described above with reference to FIG. 1. Also, according to an example embodiment, the semiconductor light emitting device 100 of FIG. 1 in which the filler layer 160 is formed of a conductive material may be mounted in a flipchip structure such that both the first and second electrodes 170 and 180 are disposed in a lower side toward the mounting board 2010.

Figure 10:
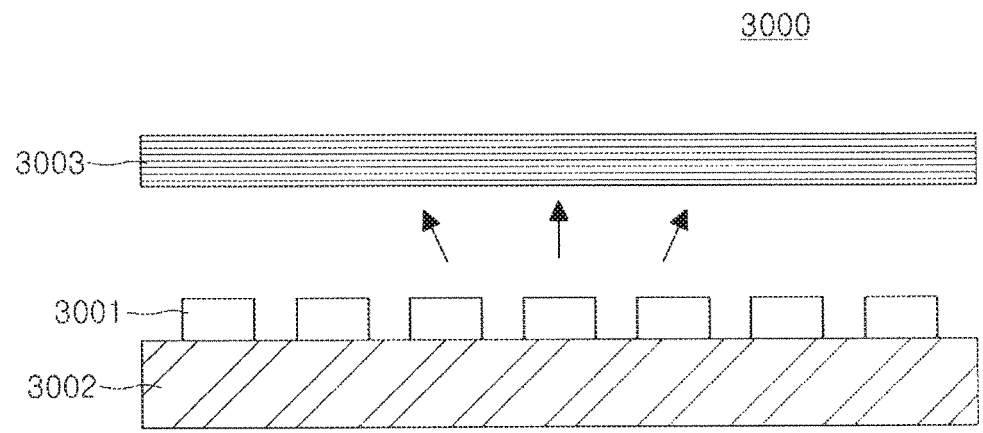
FIGS. 10 and 11 are cross-sectional front elevation views illustrating examples of backlight units employing a semiconductor light emitting device according to an example embodiment of the present disclosure.

Referring to FIG. 10, a backlight unit 3000 includes light sources 3001 mounted on a substrate 3002 and one or more optical sheets 3003 disposed above the light sources 3001. The semiconductor light emitting device package having the structure described above with reference to FIGS. 8 and 9 or a structure similar thereto may be used as the light sources 3001. Alternatively, a semiconductor light emitting device may be directly mounted on the substrate 3002 (a so-called COB type) and used.

Figure 11:
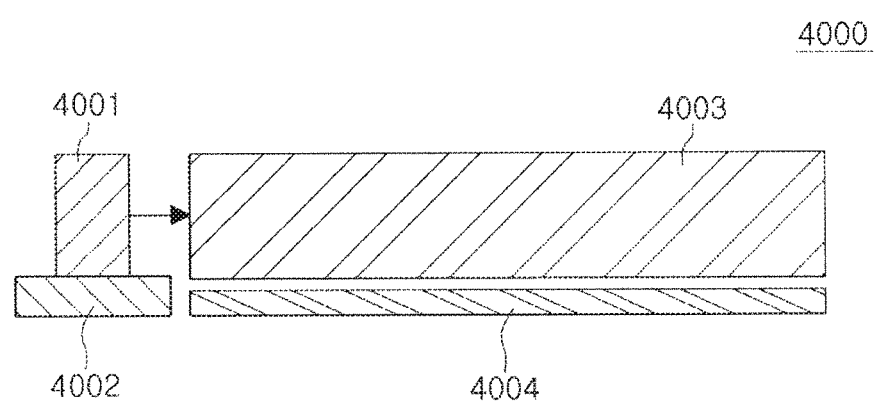

Unlike the backlight unit 3000 in FIG. 10 in which the light sources 3001 emit light toward an upper side where a liquid crystal display is disposed, a backlight unit 4000 as another example illustrated in FIG. 11 is configured such that a light source 4001 mounted on a substrate 4002 emits light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 12:
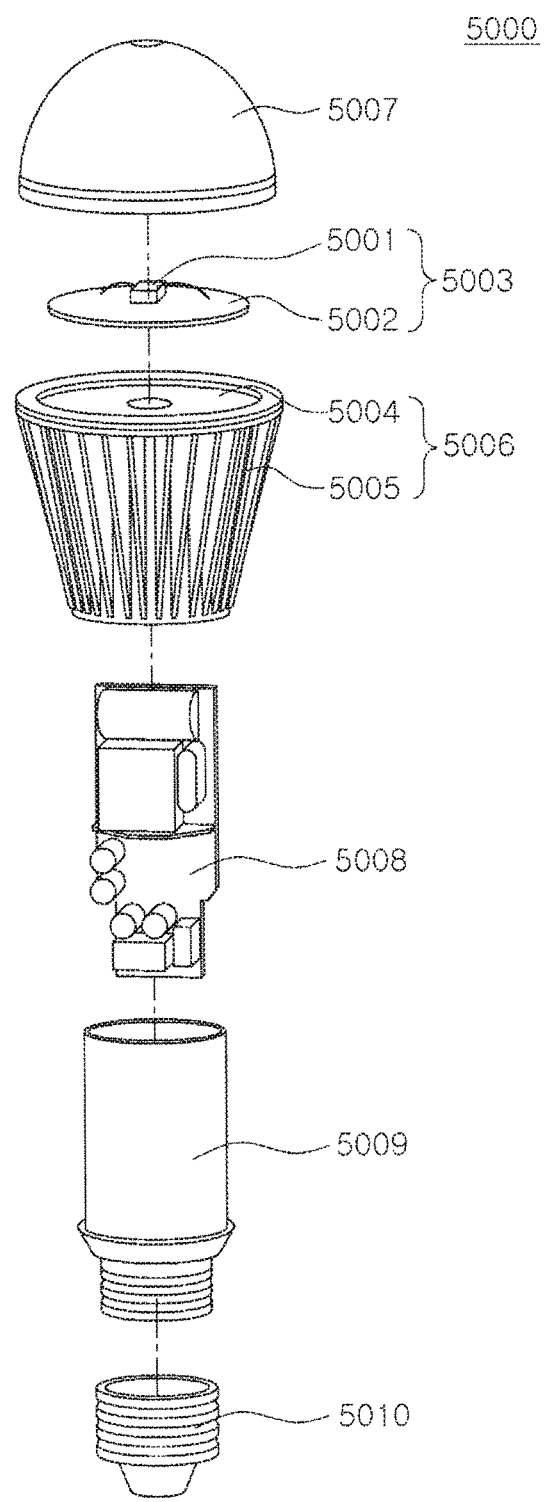
FIG. 12 is an exploded perspective view illustrating an example of a lighting device employing a semiconductor light emitting device according to an example embodiment of the present disclosure.

Referring to the exploded perspective view of FIG. 12, a lighting device 5000 is illustrated as, for example, a bulb-type lamp and includes a light emitting module 5003, a driving unit 5008, and an external connection unit 5010. Also, the lighting device 5000 may further include external structures such as external and internal housings 5006 and 5009 and a cover unit 5007. The light emitting module 5003 may include a semiconductor light emitting device 5001 having a structure identical or similar to that of the semiconductor light emitting device 100 or 100b of FIG. 1 or 7, and a circuit board 5002 having the semiconductor light emitting device 5001 mounted thereon, In the present example embodiment, it is illustrated that a single semiconductor light emitting device 5001 is mounted on the circuit board 5002, but a plurality of semiconductor light emitting devices may be installed as needed. Also, the semiconductor light emitting device 5001 may be manufactured as a package and subsequently mounted, rather than being directly mounted on the circuit board 5002.

The external housing 5006 may serve as a heat dissipation unit and may include a heat dissipation plate 5004 disposed to be in direct contact with the light emitting module 5003 to enhance heat dissipation, and heat dissipation fins 5005 surrounding the lateral surfaces of the lighting device 5000. Also, the cover unit 5007 may be installed on the light emitting module 5003 and have a convex lens shape. The driving unit 5008 may be installed in the internal housing 5009 and connected to the external connection unit 5010 having a socket structure to receive power from an external power source. Also, the driving unit 5008 may serve to convert power into an appropriate current source for driving the semiconductor light emitting device 5001 of the light emitting module 5003, and provide the same. For example, the driving unit 5008 may be configured as an AC-DC converter, a rectifying circuit component, or the like.

Also, although not shown, the lighting device 5000 may further include a communications module.

Figure 13:
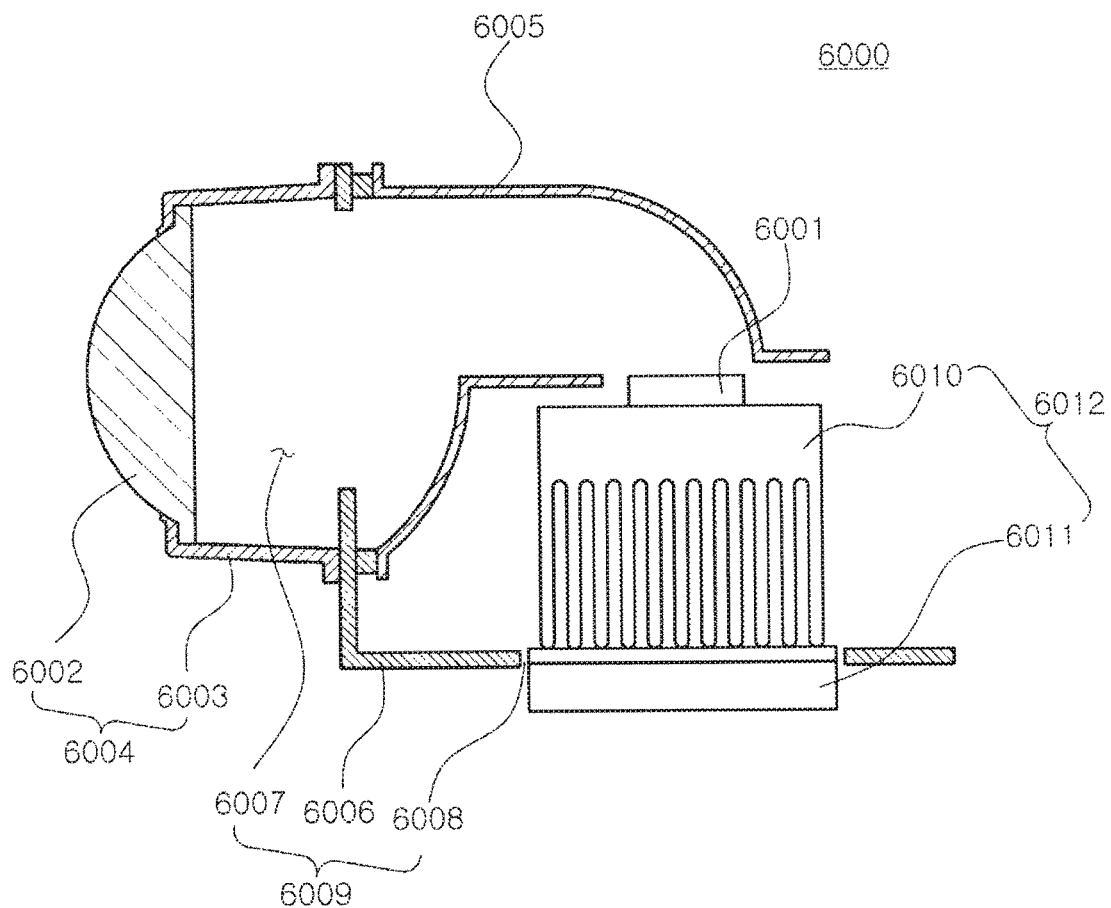
FIG. 13 is a cross-sectional front elevation view illustrating an example of a headlamp employing a semiconductor light emitting device according to an example embodiment of the present disclosure.

Referring to FIG. 13, a headlamp 6000 used as a vehicle lamp, or the like, may include a light source 6001, a reflective unit 6005, and a lens cover unit 6004. The lens cover unit 6004 may include a hollow guide 6003 and a lens 6002. The light source 6001 may include at least one of semiconductor light emitting device packages of FIGS. 8 and 9. The headlamp 6000 may further include a heat dissipation unit 6012 outwardly dissipating heat generated by the light source 6001. In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a body unit 6006 and a central hole 6008 formed in one surface thereof, in which the heat dissipation unit 6012 is coupled. Also, the housing 6009 may have a front hole 6007 formed in the other surface integrally connected to the one surface and bent in a right angle direction. The reflective unit 6005 is fixed to the housing 6009 such that light generated by the light source 6001 is reflected thereby to pass through the front hole 6007 to be output outwardly.

As set forth above, according to example embodiments of the present disclosure, a semiconductor light emitting device including an electric charge blocking layer having doping concentration and thickness optimized to reduce a leakage current and enhance light extraction efficiency may be provided.

Advantages and effects of the present disclosure are not limited to the foregoing content and any other technical effects not mentioned herein may be easily understood by a person skilled in the art from the foregoing description.

While example embodiments have been shown and described above, it will be apparent to those skilled in the art that modifications and variations could be made without departing from the spirit and scope of the present disclosure as defined by the appended claims.

What is claimed is:

1. A semiconductor light emitting device, comprising:
a first conductivity-type semiconductor base layer, the first conductivity-type semiconductor base layer including a first surface opposite a second surface;
a plurality of light emitting nanostructures disposed spaced apart from one another on the first surface of the first conductivity-type semiconductor base layer, and each of the plurality of light emitting nanostructures including a first conductivity-type semiconductor core, an active layer, an electric charge blocking layer, and a second conductivity-type semiconductor layer, respectively,
a first electrode and a second electrode electrically connected to the first conductivity-type semiconductor base layer and the second conductivity-type semiconductor layer, respectively, the first electrode on the second surface of the first conductivity-type semiconductor base layer, and the second electrode facing the first electrode such that the first conductivity-type semiconductor base layer and the plurality of light emitting nanostructures are between the first electrode and the second electrode,
wherein the electric charge blocking layer has different thicknesses on a first crystal plane and a second crystal plane of the first conductivity-type semiconductor core and includes an impurity having a first concentration, the second conductivity-type semiconductor layer includes the impurity having a second concentration, and the first concentration is half or less of the second concentration.

2. The semiconductor light emitting device of claim 1, wherein the plurality of light emitting nanostructures extend downwardly from the first conductivity-type semiconductor base layer toward the second electrode.

3. The semiconductor light emitting device of claim 1, wherein
the second electrode includes a contact electrode layer and a bonding electrode layer,
the contact electrode layer fills spaces between adjacent light emitting nanostructures among the plurality of light emitting nanostructures,
the contact electrode layer covers the plurality of light emitting nanostructures, the bonding electrode layer is on a bottom surface of the contact electrode layer, and the bonding electrode layer has a planar shape.

4. The semiconductor light emitting device of claim 1, wherein a thickness of the electric charge blocking layer is less than a thickness of the second conductivity-type semiconductor layer.

5. The semiconductor light emitting device of claim 1, wherein the first concentration comprises an impurity concentration in a region of at least one of a first or a second crystal plane of the electric charge blocking layer.

6. The semiconductor light emitting device of claim 1, wherein the electric charge blocking layer has an impurity concentration greater in a region on the first crystal planes than in a region on the second crystal planes.

7. The semiconductor light emitting device of claim 1, wherein the electric charge blocking layer has a thickness greater on the first crystal planes than on the second crystal planes.

8. The semiconductor light emitting device of claim 1, wherein the impurity comprises a p-type impurity.

9. The semiconductor light emitting device of claim 8, wherein the impurity comprises magnesium (Mg).

10. The semiconductor light emitting device of claim 1, wherein the electric charge blocking layer includes AlGaN or AlInGaN.

11. The semiconductor light emitting device of claim 1, wherein the first crystal planes comprise non-polar planes, and the second crystal planes comprise polar planes or semi-polar planes.

12. The semiconductor light emitting device of claim 11, wherein the first crystal planes comprise m planes and the second crystal planes comprise r planes.

13. The semiconductor light emitting device of claim 1, wherein the plurality of light emitting nanostructures further include a transparent electrode layer positioned on the second conductivity-type semiconductor layer.

14. The semiconductor light emitting device of claim 1, further comprising:
a conductive substrate bonded to the second electrode, wherein
the second electrode includes a contact electrode-layer and a bonding electrode layer, and
the bonding electrode layer is directly connected to the conductive substrate and the contact electrode layer.

15. A light emitting device package, comprising:
a mounting board; and
the semiconductor light emitting device of claim 1 mounted on the mounting board.

16. The light emitting device package of claim 15, wherein the plurality of light emitting nanostructures extend downwardly from the first conductivity-type semiconductor base layer within the second electrode.

17. The light emitting device package of claim 15, further comprises a conductive substrate bonded to a bottom surface of the second electrode,
the second electrode is disposed between the conductive substrate and the first conductivity-type semiconductor base layer and filling spaces between the plurality of light emitting nanostructures.

18. The light emitting device package of claim 15, further comprising an encapsulant encapsulating the semiconductor light emitting device.

19. A semiconductor light emitting device, comprising:
a conductive substrate;
a first conductivity-type semiconductor base layer having a first surface spaced apart from the conductive substrate and facing the conductive substrate and a second surface disposed opposite to the first surface;
a plurality of light emitting nanostructures disposed spaced apart from one another on the first surface of the first conductivity-type semiconductor base layer and each of the plurality of light emitting nanostructures including a first conductivity-type semiconductor core, an active layer, an electric charge blocking layer, and a second conductivity-type semiconductor layer, respectively;
a first electrode disposed on the second surface of the first conductivity-type semiconductor base layer; and
a second electrode disposed between the conductive substrate and the first conductivity-type semiconductor base layer.

20. The semiconductor light emitting device of claim 19, wherein
the second electrode electrically connects the second conductivity-type semiconductor layer with the conductive substrate.

* * * * *